US012567840B2

(12) United States Patent
Jo et al.

(10) Patent No.: US 12,567,840 B2
(45) Date of Patent: Mar. 3, 2026

(54) DISTRIBUTED AMPLIFIER

(71) Applicant: NTT, Inc., Tokyo (JP)

(72) Inventors: Teruo Jo, Tokyo (JP); Munehiko Nagatani, Tokyo (JP); Hideyuki Nosaka, Tokyo (JP)

(73) Assignee: NTT, INC., Tokyo (JP)

( * ) Notice: Subject to any disclaimer, the term of this patent is extended or adjusted under 35 U.S.C. 154(b) by 623 days.

(21) Appl. No.: 18/002,939

(22) PCT Filed: Jun. 26, 2020

(86) PCT No.: PCT/JP2020/025273
§ 371 (c)(1),
(2) Date: Dec. 22, 2022

(87) PCT Pub. No.: WO2021/260926
PCT Pub. Date: Dec. 30, 2021

(65) Prior Publication Data
US 2023/0253929 A1     Aug. 10, 2023

(51) Int. Cl.
H03F 3/60 (2006.01)
H03F 1/42 (2006.01)
H03F 1/02 (2006.01)

(52) U.S. Cl.
CPC .............. H03F 1/42 (2013.01); H03F 3/605 (2013.01); H03F 1/0288 (2013.01); H03F 2200/36 (2013.01)

(58) Field of Classification Search
CPC ........ H03F 1/42; H03F 3/605; H03F 2200/36; H03F 2200/451; H03F 1/22; H03F 3/245;
(Continued)

(56) References Cited

U.S. PATENT DOCUMENTS 5,021,743 A * 6/1991 Chu ........................ H03F 3/607
330/277
6,930,557 B2 * 8/2005 Shigematsu ............ H03F 3/193
330/54
(Continued)

OTHER PUBLICATIONS

Beyer et al., "MESFET Distributed Amplifier Design Guidelines," IEEE Transactions on Microwave Theory and Techniques, vol. 32, No. 3, pp. 268-275, Mar. 1984, 8 pages.
(Continued)

*Primary Examiner* — Khanh V Nguyen
(74) *Attorney, Agent, or Firm* — Slater Matsil, LLP

(57) ABSTRACT

An embodiment is a distributed amplifier including amplifier blocks, each of the amplifier blocks including a first transmission line to receive input of a signal to an input end, a second transmission line to output a signal from an output end, a first termination resistor having a first end connected to a terminal end of the first transmission line, a second termination resistor having a first end connected to an input end of the second transmission line, and unit cells arranged along the first and second transmission lines, each of the unit cells having an input terminal connected to the first transmission line and an output terminal connected to the second transmission line, the amplifier blocks are connected in cascade such that a terminal end of the second transmission line of one of the amplifier blocks is connected to the first transmission line of a subsequent amplifier block.

6 Claims, 16 Drawing Sheets

(58) Field of Classification Search
CPC . H03F 3/60; H03F 3/602; H03F 3/607; H03F
3/54; H03F 1/20; H04B 3/06
USPC ............................................ 330/53, 54, 286
See application file for complete search history.

(56) References Cited

U.S. PATENT DOCUMENTS

| | | | |
|---|---|---|---|
| 7,724,091 B2 * | 5/2010 | Vickes | H03F 3/602 330/54 |
| 8,823,455 B2 * | 9/2014 | Kobayashi | H03F 3/605 330/53 |

OTHER PUBLICATIONS

Eriksson et al., "InP DHBT Distributed Amplifiers With Up to 235-GHz Bandwidth," IEEE Transactions on Microwave Theory and Techniques, vol. 63, No. 4, pp. 1334-1341, Apr. 2015, 8 pages.

* cited by examiner

Vcas1 o— Q31 a o— Q30

VEE

Prior Art
Fig. 15

FREQUENCY (GHz)

DISTRIBUTED AMPLIFIER

This patent application is a national phase filing under section 371 of PCT/JP2020/025273, filed Jun. 26, 2020, which is incorporated herein by reference in its entirety.

TECHNICAL FIELD

The present invention relates to distributed circuits, and more particularly to distributed amplifiers.

BACKGROUND

Wideband amplifiers are desired in various systems such as ones for high-speed communication and high-resolution radars. Distributed amplifiers have been proposed as a technique to widen the bandwidth of the amplifier (See Patent Literature 1). FIG. 13 is a circuit diagram illustrating a configuration of a conventional distributed amplifier. The distributed amplifier includes an input transmission line CPW10 having an input end connected to a signal input terminal 1, an output transmission line CPW20 having a terminal end connected to a signal output terminal 2, an input termination resistor Ri1 having a first end connected to the terminal end of the transmission line CPW10 and a second end connected to a bias voltage Vb_1, an output termination resistor Ro2 that connects the input end of the transmission line CPW20 to the ground, and a plurality of unit cells 3 arranged along the transmission lines CPW10 and CPW20, each of the unit cells having an input terminal "a" connected to the transmission line CPW10 and an output terminal "b" connected to the transmission line CPW20.

The transmission line CPW10 includes a plurality of transmission lines CPW1$i$, CPW1, and CPW10 connected in series. Similarly, the transmission line CPW20 includes a plurality of transmission lines CPW2$i$, CPW2, and CPW20 connected in series.

As illustrated in FIG. 14, each unit cell 3 includes an input transistor Q30 having a base terminal connected to the transmission line CPW10 and an emitter terminal connected to a power supply voltage VEE, and an output transistor Q31 having a base terminal connected to a bias voltage Vcas1, a collector terminal connected to the transmission line CPW20, and an emitter terminal connected to the collector terminal of the input transistor Q30.

In a distributed amplifier, the parasitic capacitance of the transistors Q30 and Q31 are incorporated into the input and output transmission lines CPW10 and CPW20 to make an impedance matching. In addition, the propagation constants of the input and output transmission lines CPW10 and CPW20 are matched to achieve wideband signal amplification.

To improve the gain of the distributed amplifier, in general, a method in which the number of stages (the number of unit cells 3 arranged in parallel) is increased is employed as illustrated in FIG. 15.

However, the conventional distributed amplifier has a problem in that as the number of stages is increased, the bandwidth deteriorates. FIG. 16 is a graph showing simulation results of the S parameters S21 of 6-stage and 12-stage distributed amplifiers. In FIG. 16, S21_6 indicates the S parameter S21 of the 6-stage distributed amplifier, and S21_12 the S parameter S21 of the 12-stage distributed amplifier. In FIG. 16, it can be seen that from the 6 stages to the 12 stages, the direct current (DC) gain is improved, but the bandwidth deteriorates significantly. This bandwidth deterioration results from signal attenuation in the input and output transmission lines. In general, the relationship between the bandwidth and the optimal number of stages Nopt (in other words, the maximum gain) has been made clear by Patent Literature 2. Hence, it has been difficult for the conventional distributed amplifier to improve the gain without degrading the bandwidth.

CITATION LIST

Non-Patent Literature

Non-Patent Literature 1: Klas Eriksson, Izzat Darwazeh, and Herbert Zirath, "InP DHBT distributed amplifiers with up to 235-GHz bandwidth", IEEE Transactions on Microwave Theory and Techniques, VOL. 63, NO. 4, PP. 1334-1341, 2015

Non-Patent Literature 2: James B. Beyer, et al., "MESFET distributed amplifier design guidelines", IEEE Transactions on Microwave Theory and Techniques, VOL. 32, NO. 3, PP. 268-275, 1984

SUMMARY

Technical Problem

The present invention has been made to solve the above problems, and an object thereof is to provide a distributed amplifier in which the gain is improved without degrading the bandwidth.

Means for Solving the Problem

A distributed amplifier according to an embodiment of the present invention is a distributed amplifier including N amplifier blocks, where N is an integer of 2 or more, in which each of the amplifier blocks includes a first transmission line having an input end that receives input of a signal, a second transmission line having an output end that outputs a signal, a first termination resistor having a first end connected to a terminal end of the first transmission line, a second termination resistor having a first end connected to an input end of the second transmission line, and a plurality of unit cells arranged along the first and second transmission lines, each of the unit cells having an input terminal connected to the first transmission line and an output terminal connected to the second transmission line, the amplifier blocks are connected in cascade such that a terminal end of the second transmission line of each of the amplifier blocks is connected to the input end of the first transmission line of a subsequent amplifier block, a second end of the first termination resistor of each of the amplifier blocks is connected to a first bias voltage, a second end of the second termination resistor of each of the amplifier blocks except the amplifier block in the last stage is connected to a first power supply voltage, and a second end of the second termination resistor of the amplifier block in the last stage is connected to a ground, the values of the characteristic impedances of all the transmission lines and all the first and second termination resistors are 50Ω, and the first power supply voltage of the amplifier block in the n-th stage is set to Vb_(n+1)+Iopt×Nopt×50, where n is an integer from 1 to N−1, Vb_(n+1) is the first bias voltage of the amplifier block in the (n+1)-th stage, Nopt is the number of the unit cells in each of the amplifier blocks, and Iopt is the current that flows between the input terminal and the output terminal in each of the unit cells.

Another distributed amplifier according to an embodiment of the present invention is a distributed amplifier including N amplifier blocks, where N is an integer of 2 or more, in which each of the amplifier blocks includes a first transmission line having an input end that receives input of a signal, a second transmission line having an output end that outputs a signal, a first termination resistor having a first end connected to a terminal end of the first transmission line, a second termination resistor having a first end connected to an input end of the second transmission line, and a plurality of unit cells arranged along the first and second transmission lines, each of the unit cells having an input terminal connected to the first transmission line and an output terminal connected to the second transmission line, the amplifier blocks are connected in cascade such that a terminal end of the second transmission line of each of the amplifier blocks is connected to the input end of the first transmission line of a subsequent amplifier block, a second end of the first termination resistor of each of the amplifier blocks is connected to a first bias voltage, and a second end of the second termination resistor of each of the amplifier blocks is connected to a ground, the values of the first transmission line of the amplifier block in the first stage, the first termination resistor of the amplifier block in the first stage, the characteristic impedance of the second transmission line of the amplifier block in the last stage, and the second termination resistor of the amplifier block in the last stage are 50Ω, and the characteristic impedance of the second transmission line of the amplifier block in the n-th stage, the second termination resistor of the amplifier block in the n-th stage, the characteristic impedance of the first transmission line of the amplifier block in the (n+1)-th stage, and the first termination resistor of the amplifier block in the (n+1)-th stage are set to $-Vb_{(n+1)}/(Iopt \times Nopt)$, where n is an integer from 1 to N−1, $Vb_{(n+1)}$ is the first bias voltage of the amplifier block in the (n+1)-th stage, Nopt is the number of the unit cells in each of the amplifier blocks, and Iopt is the current that flows between the input terminal and the output terminal in each of the unit cells.

Still another distributed amplifier according to an embodiment of the present invention is a distributed amplifier including N amplifier blocks, where N is an integer of 2 or more, in which each of the amplifier blocks includes a first transmission line having an input end that receives input of a signal, a second transmission line having an output end that outputs a signal, a first termination resistor having a first end connected to a terminal end of the first transmission line, a second termination resistor having a first end connected to an input end of the second transmission line, and a plurality of unit cells arranged along the first and second transmission lines, each of the unit cells having an input terminal connected to the first transmission line and an output terminal connected to the second transmission line, the amplifier blocks are connected in cascade such that a terminal end of the second transmission line of each of the amplifier blocks is connected to the input end of the first transmission line of a subsequent amplifier block, a second end of the first termination resistor of each of the amplifier blocks is connected to a first bias voltage, and a second end of the second termination resistor of each of the amplifier blocks is connected to a ground, the values of the characteristic impedances of all the transmission lines and all the first and second termination resistors are 50Ω, and a transistor whose optimal current is $-Vb_{(n+1)}/(Nopt\_n \times 50)$ is used in each of the unit cells of the amplifier block in the n-th stage, where n is an integer from 1 to N−1, $Vb_{(n+1)}$ is the first bias voltage of the amplifier block in the (n+1)-th stage, and Nopt_n is the number of the unit cells of the amplifier block in the n-th stage.

Effects of the Invention

In embodiments of the present invention, the second end of the first termination resistor of each of the amplifier blocks is connected to the first bias voltage, the second end of the second termination resistor of each of the amplifier blocks except the one in the last stage is connected to the first power supply voltage, the second end of the second termination resistor of the amplifier block in the last stage is connected to the ground, the values of the characteristic impedances of all the transmission lines and all the first and second termination resistors are set to 50Ω, and the first power supply voltage of the amplifier block in the n-th stage is set to $Vb_{(n+1)}+Iopt \times Nopt \times 50$. Thus, it is possible to improve the gain without degrading the bandwidth.

Also, in embodiments of the present invention, the second end of the first termination resistor of each of the amplifier blocks is connected to the first bias voltage, the second end of the second termination resistor of each of the amplifier blocks is connected to the ground, the values of the first transmission line of the amplifier block in the first stage, the first termination resistor of the amplifier block in the first stage, the characteristic impedance of the second transmission line of the amplifier block in the last stage, and the second termination resistor of the amplifier block in the last stage are set to 50Ω, and the characteristic impedance of the second transmission line in the amplifier block in the n-th stage, the second termination resistor of the amplifier block in the n-th stage, the characteristic impedance of the first transmission line of the amplifier block in the (n+1)-th stage, and the first termination resistor of the amplifier block in the (n+1)-th stage are set to $-Vb_{(n+1)}/(Iopt \times Nopt)$. Thus, it is possible to improve the gain without degrading the bandwidth.

Also, in embodiments of the present invention, the second end of the first termination resistor of each of the amplifier blocks is connected to the first bias voltage, the second end of the second termination resistor of each of the amplifier blocks is connected to the ground, the values of the characteristic impedances of all the transmission lines, and all the first and second termination resistors are set to 50Ω, and a transistor whose optimal current is $-Vb_{(n+1)}/(Nopt\_n \times 50)$ is used in each of the unit cells of the amplifier block in the n-th stage. Thus, it is possible to improve the gain without degrading the bandwidth.

BRIEF DESCRIPTION OF THE DRAWINGS

FIG. 7 is a circuit diagram illustrating a configuration of a unit cell of the distributed amplifier according to the second embodiment of the present invention.

Figure 14:
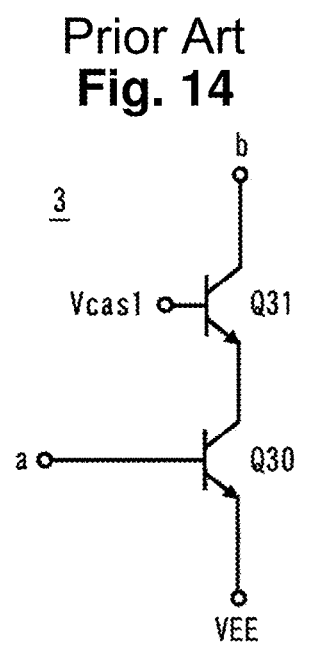

FIG. 14 is a circuit diagram illustrating a configuration of a unit cell of the conventional distributed amplifier.

Figure 15:
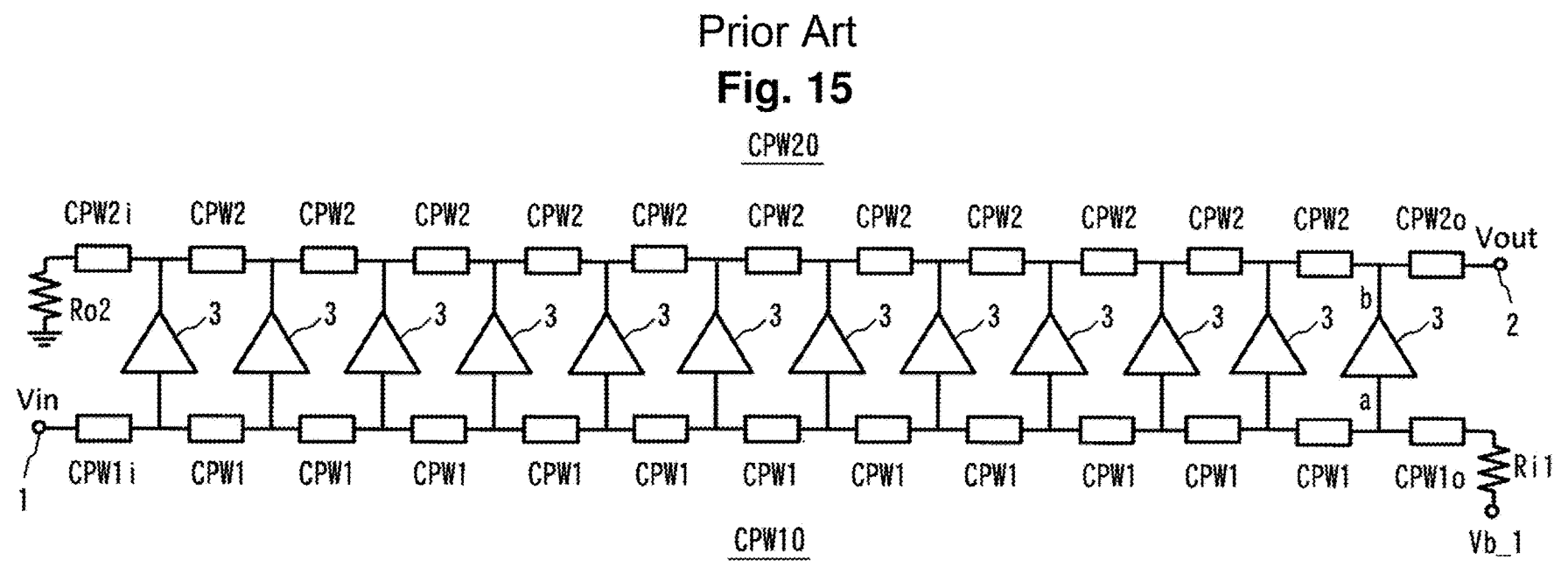

FIG. 15 is a circuit diagram illustrating a configuration of a distributed amplifier having a larger number of stages to increase the gain.

DETAILED DESCRIPTION OF ILLUSTRATIVE EMBODIMENTS

First Embodiment

Figure 1:
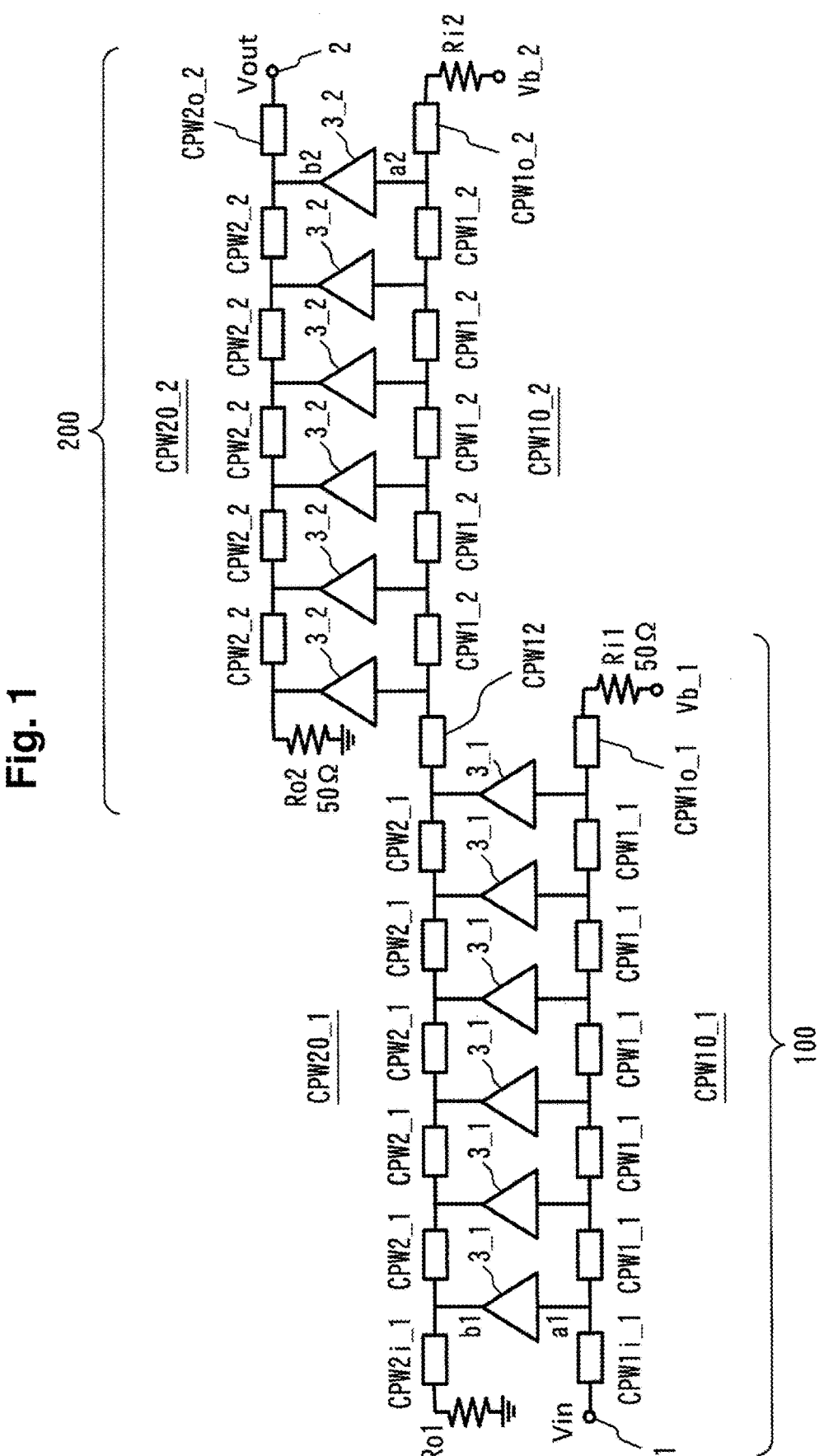
FIG. 1 is a circuit diagram illustrating a configuration of a distributed amplifier according to a first embodiment of the present invention.

Hereinafter, embodiments of the present invention will be described with reference to the drawings. FIG. 1 is a circuit diagram illustrating a configuration of a distributed amplifier according to a first embodiment of the present invention. The distributed amplifier of the present embodiment includes an amplifier block 100 and an amplifier block 200 connected in cascade, the amplifier block 100 having an optimal number Nopt of stages, the amplifier block 200 having an optimal number Nopt of stages. Here, the optimal number Nopt of stages means the number of stages (the number of unit cells arranged in parallel) that provides a desired frequency response of the amplifier block. In the example of FIG. 1, Nopt=6.

The amplifier block 100 includes an input transmission line CPW10_1 having an input end connected to a signal input terminal 1, an output transmission line CPW20_1, an input termination resistor Ri1 having a first end connected to the terminal end of the transmission line CPW10_1 and a second end connected to a bias voltage Vb_1, an output termination resistor Ro1 having a first end connected to the input end of the transmission line CPW20_1 and a second end connected to the ground, a plurality of unit cells 3_1 arranged along the transmission lines CPW10_1 and CPW20_1, each of the unit cells having an input terminal a1 connected to the transmission line CPW10_1 and an output terminal b1 connected to the transmission line CPW20_1. The input termination resistor Ri1 is 50Ω. The output termination resistor Ro1 will be described later.

The transmission line CPW10_1 includes a plurality of transmission lines CPW1*i*_1, CPW1_1, and CPW10_1 connected in series. The transmission line CPW1_1 between unit cells and the transmission line CPW1*i*_1 on the input side have different characteristic impedances. The reason is that the transmission line CPW1*i*_1 needs to absorb the effects of the parasitic capacitance of the circuit or the like in the previous stage of the signal input terminal 1. Similarly, the transmission line CPW1_1 and CPW10_1 have different characteristic impedances. The reason is that the transmission line CPW10_1 needs to absorb the effects of the parasitic capacitance of the input termination resistor Ri1.

The transmission line CPW20_1 includes a plurality of transmission lines CPW2*i*_1, CPW2_1, and CPW12 connected in series. The transmission line CPW2 between unit cells and the transmission line CPW2*i*_1 on the input side have different characteristic impedances. The reason is that the transmission line CPW2*i*_1 needs to absorb the effects of the parasitic capacitance of the output termination resistor Ro1. Similarly, the transmission lines CPW2_1 and CPW12 have different characteristic impedances. The reason is that the transmission line CPW12 needs to absorb the effects of the parasitic capacitance of the amplifier block 200 which is a subsequent stage of the transmission line CPW20_1.

The amplifier block 200 includes an input transmission line CPW10_2 having an input end connected to the terminal end of the transmission line CPW20_1 of the amplifier block 100, an output transmission line CPW20_2 having a terminal end connected to a signal output terminal 2, an input termination resistor Ri2 having a first end connected to the terminal end of the transmission line CPW10_2 and a second end connected to a bias voltage Vb_2, an output termination resistor Ro2 having a first end connected to the input end of the transmission line CPW20_2 and a second end connected to the ground, and a plurality of unit cells 3_2 arranged along the transmission lines CPW10_2 and CPW20_2, each of the unit cells having an input terminal a2 connected to the transmission line CPW10_2 and an output terminal b2 connected to the transmission line CPW20_2. The output termination resistor Ro2 is 50Ω. The input termination resistor Ri2 will be described later.

The transmission line CPW10_2 includes a plurality of transmission lines CPW12, CPW1_2, and CPW10_2 connected in series. The transmission line CPW1_2 between unit cells and the transmission line CPW12 on the input side have different characteristic impedances. The reason is that the transmission line CPW12 needs to absorb the effects of the parasitic capacitance of the amplifier block 100 which is in the previous stage of the transmission line CPW10_2. Similarly, the transmission lines CPW1_2 and CPW10_2 have different characteristic impedances. The reason is that the transmission line CPW10_2 needs to absorb the effects of the parasitic capacitance of the input termination resistor Ri2.

Note that in the present embodiment, the output transmission line CPW20_1 of the amplifier block 100 and the input transmission line CPW10_2 of the amplifier block 200 share the transmission line CPW12.

The transmission line CPW20_2 includes a plurality of transmission lines CPW2_2 and CPW20_2 connected in series. The transmission line CPW2_2 between unit cells and the transmission line CPW20_2 have different characteristic impedances. The reason is that the transmission line CPW20_2 needs to absorb the effects of the parasitic capacitance of the circuit or the like in the subsequent stage of the signal output terminal 2. The configurations of the unit cells 3_1 and 3_2 will be described in the second embodiment.

In the present embodiment, the amplifier block 100 having an optimal number Nopt of stages and the amplifier block 200 of an optimal number Nopt of stages, connected in cascade make it possible to improve the gain without degrading the bandwidth.

In the present embodiment, the characteristic impedance Zo of the output transmission line CPW20_1 of the amplifier block 100, the output termination resistor Ro1, the characteristic impedance Zo of the input transmission line CPW10_2 of the amplifier block 200, and the input termination resistor Rig are higher than 50Ω and expressed in the following expression.

$$Zo = Ro1 = Ri2 = -Vb\_2/(Iopt \times Nopt) \qquad (1)$$

In expression (1), Iopt is a current that flows between the input terminal and the output terminal of each of the unit cells 3_1 and 3_2. The bias voltages Vb_1 and Vb_2 are negative voltages.

In the present embodiment, setting the characteristic impedance Zo of the transmission lines CPW20_1 and CPW10_2, the output termination resistor Ro1, and the input termination resistor Ri2 as shown in expression (1) makes it possible to DC-couple the amplifier block 100 and the amplifier block 200, and thus, making it possible to further improve the gain while enabling amplification of signals from DC to high frequencies.

Second Embodiment

Figure 2:
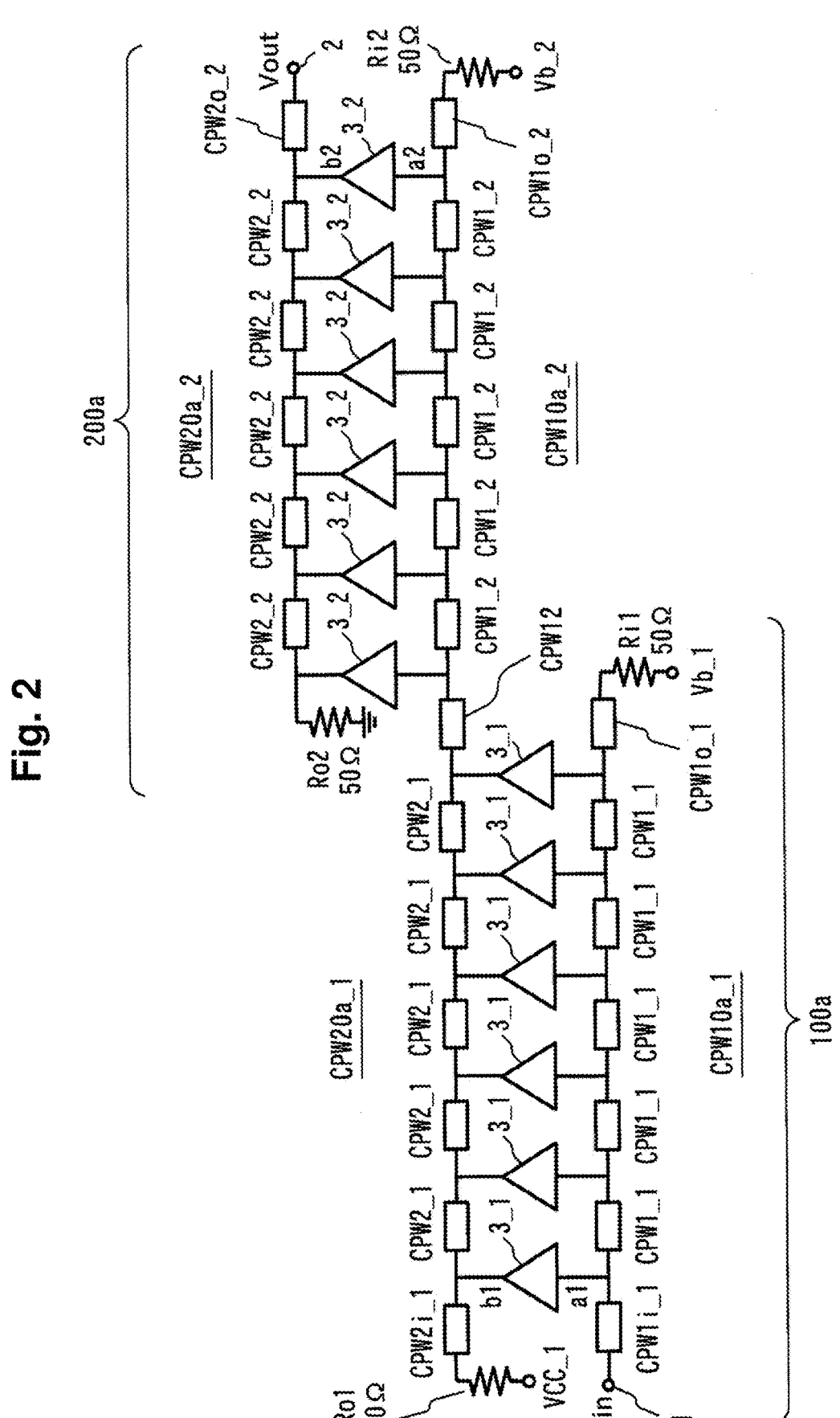
FIG. 2 is a circuit diagram illustrating a configuration of a distributed amplifier according to a second embodiment of the present invention.

Next, a second embodiment of the present invention will be described. FIG. 2 is a circuit diagram illustrating a configuration of a distributed amplifier according to the second embodiment of the present invention. The distributed amplifier of the present embodiment includes an amplifier block 100a and an amplifier block 200a connected in cascade, the amplifier block 100a having an optimal number (Nopt=6) of stages, the amplifier block 200a having an optimal number (Nopt=6) of stages.

The amplifier block 100a includes an input transmission line CPW10a_1, an output transmission line CPW20a_1, an input termination resistor Ri1, an output termination resistor Ro1 having a first end connected to the input end of the transmission line CPW20a_1 and a second end connected to a power supply voltage VCC_1, and a plurality of unit cells 3_1 arranged along the transmission line CPW10a_1 and CPW20a_1, each of the unit cells having an input terminal a1 connected to the transmission line CPW10a_1 and an output terminal b1 connected to the transmission line CPW20a_1. The input termination resistor Ri1 and the output termination resistor Ro1 are 50Ω.

The transmission line CPW10a_1 has the same configuration as the transmission line CPW10_1 of the first embodiment. The transmission line CPW20a_1 has a configuration the same as or similar to that of the transmission line CPW20_1 of the first embodiment, but the characteristic impedance Zo is 50Ω.

The amplifier block 200a includes an input transmission line CPW10a_2, an output transmission line CPW20a_2, an input termination resistor Ri2 having a first end connected to the terminal end of the transmission line CPW10a_2 and a second end connected to the bias voltage Vb_2, an output termination resistor Ro2, and a plurality of unit cells 3_2 arranged along the transmission lines CPW10a_2 and CPW20a_2, each of the unit cells having an input terminal a2 connected to the transmission line CPW10a_2 and an output terminal b2 connected to the transmission line CPW20a_2. The output termination resistor Ro2 and the input termination resistor Ri2 are 50Ω.

The transmission line CPW10a_2 has a configuration the same as or similar to that of the transmission line CPW10_2 of the first embodiment, but the characteristic impedance Zo is 50Ω. The transmission line CPW20a_2 has the same configuration as the transmission line CPW20_2 of the first embodiment.

Figure 3:
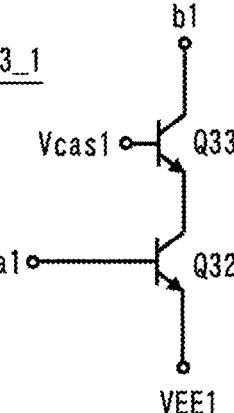
FIG. 3 is a circuit diagram illustrating a configuration of a unit cell of the distributed amplifier according to the second embodiment of the present invention.
Figure 4:
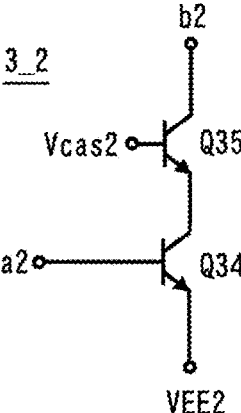
FIG. 4 is a circuit diagram illustrating a configuration of a unit cell of the distributed amplifier according to the second embodiment of the present invention.

FIG. 3 is a circuit diagram illustrating a configuration of the unit cell 3_1 in the amplifier block 100a, and FIG. 4 is a circuit diagram illustrating a configuration of the unit cell 3_2 in the amplifier block 200a. As illustrated in FIG. 3, the unit cell 3_1 includes an input transistor Q32 having a base terminal connected to the transmission line CPW10a_1 and an emitter terminal connected to a power supply voltage VEE1, and an output transistor Q33 having a base terminal connected to a bias voltage Vcas1, a collector terminal connected to the transmission line CPW20a_1, and an emitter terminal connected to the collector terminal of the input transistor Q32.

As illustrated in FIG. 4, the unit cell 3_2 includes an input transistor Q34 having a base terminal connected to the transmission line CPW10a_2 and an emitter terminal connected to a power supply voltage VEE2, and an output transistor Q35 having a base terminal connected to a bias voltage Vcas2, a collector terminal connected to the transmission line CPW20a_2, and an emitter terminal connected to the collector terminal of the input transistor Q34.

The unit cell 3_1 and the unit cell 3_2 have the same or similar circuit configuration, but the applied voltages are different. The amplifier block 100a is supplied with VCC_1 and VEE1 as power supply voltages, and Vb_1 and Vcas1 as bias voltages. The amplifier block 200a is supplied with the ground (0 V) and VEE2 as power supply voltages and Vb_2 and Vcas2 as bias voltages. The voltages VCC_1, VEE1, Vb_1, Vcas1, VEE2, Vb_2, and Vcas2 are basically negative voltages with reference to the ground.

Amplifiers used in optical communication or the like need to amplify signals from near DC to high frequencies. Hence in the present embodiment, the value of the power supply voltage VCC_1 is set as shown in the following expression, so that the output common voltage of the amplifier block 100a and the input common voltage of the amplifier block 200a can be set to the same voltage, thus, making it possible to amplify signals from DC to high frequencies without disordering the operating point of each transistor.

$$VCC\_1 = Vb\_2 + Iopt \times Nopt \times 50 \qquad (2)$$

As described in the first embodiment, Iopt is a current that flows between the input terminal and the output terminal of each of the unit cells 3_1 and 3_2 and is an optimum current for the transistors of each of the unit cells 3_1 and 3_2 to operate.

A method is conceivable in which a DC cut capacitor is inserted between the amplifier blocks, not directly connecting the amplifier blocks. However, since the value of a capacitor that can be formed on a chip is small, it is difficult to amplify signals near DC with the configuration of inserting a DC cut capacitor between the amplifier blocks.

Figure 5:
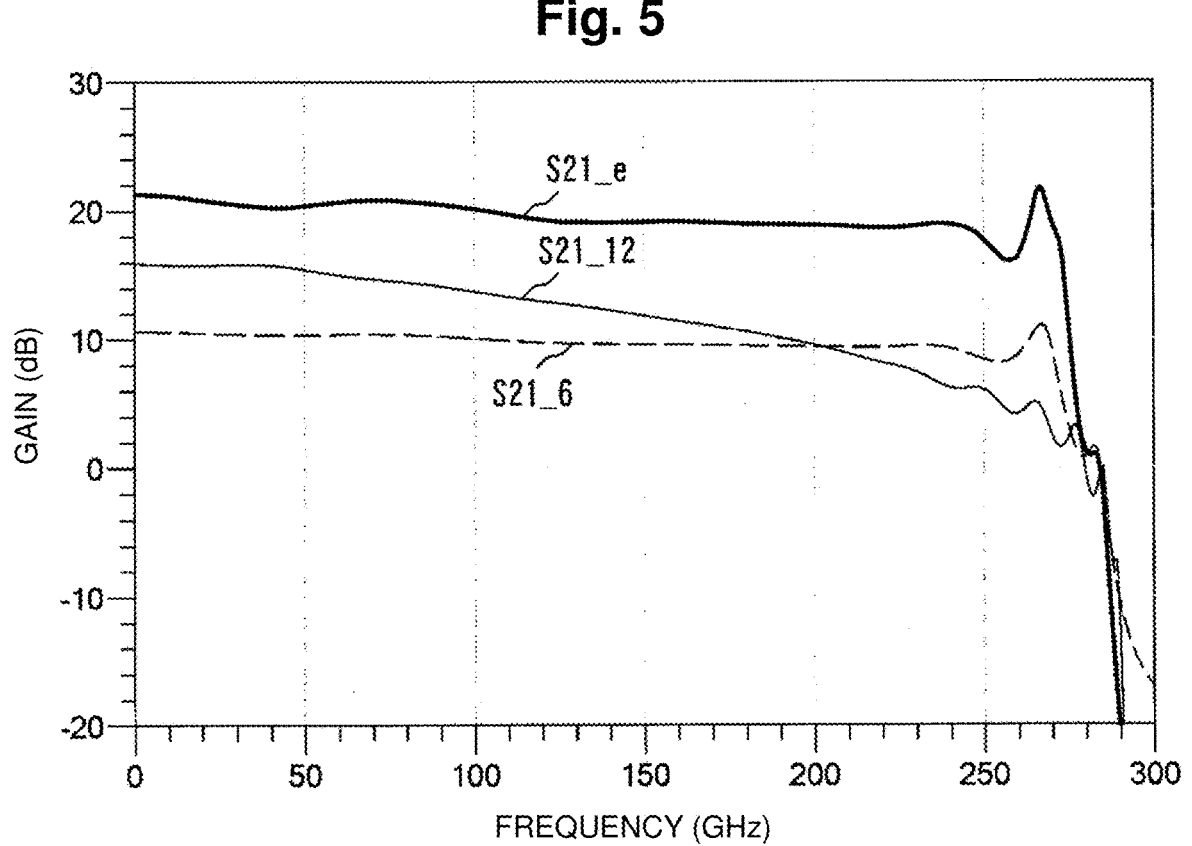
FIG. 5 is a graph illustrating simulation results of the S parameters of a conventional distributed amplifier and a distributed amplifier according to the second embodiment of the present embodiment.

FIG. 5 is a graph illustrating simulation results of the S parameters of a conventional distributed amplifier and a distributed amplifier of the present embodiment. In FIG. 5, S21_6 indicates the S parameter S21 of a conventional 6-stage distributed amplifier, S21_12 the S parameter S21 of a conventional 12-stage distributed amplifier, and S21_e the S parameter S21 of a distributed amplifier of the present embodiment. It can be seen that the present embodiment improves the gain without degrading the bandwidth, compared to the conventional 12-stage distributed amplifier.

Figure 6:
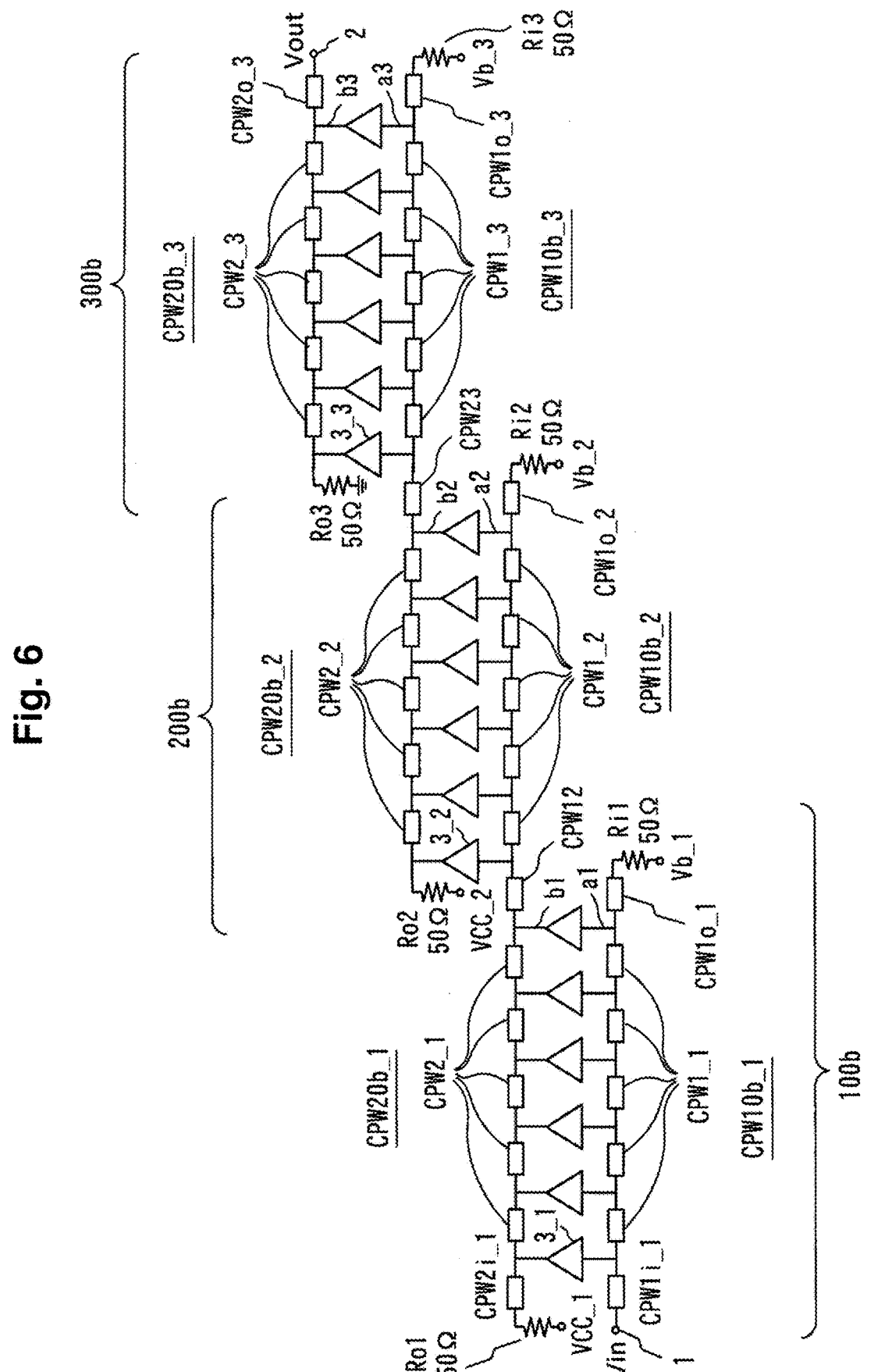
FIG. 6 is a circuit diagram illustrating another configuration of a distributed amplifier according to the second embodiment of the present invention.

Although the present embodiment has showed a case of two amplifier blocks, the number of amplifier blocks may be three or more. FIG. 6 illustrates, as an example, a configuration of three amplifier blocks. The distributed amplifier in FIG. 6 includes an amplifier block 100b, an amplifier block 200b, and an amplifier block 300b connected in cascade, the amplifier block 100b having an optimal number (Nopt=6) of stages, the amplifier block 200b having an optimal number (Nopt=6) of stages, the amplifier block 300b having an optimal number (Nopt=6) of stages.

The amplifier block 100b includes an input transmission line CPW10b_1, an output transmission line CPW20b_1, an input termination resistor Ri1, an output termination resistor Ro1, and unit cells 3_1. The amplifier block 100b has the same configuration as the amplifier block bow.

The amplifier block 200b includes an input transmission line CPW10b_2, an output transmission line CPW20b_2, an input termination resistor Ri2, an output termination resistor Ro2, and unit cells 3_2. The amplifier block 200b has a configuration the same as or similar to that of the amplifier block 200a but is different from the configuration in FIG. 2 in that a second end of the output termination resistor Ro2 is connected to a power supply voltage VCC_2, not to the ground. Setting of the power supply voltage VCC_2 will be described later.

The amplifier block 300b includes an input transmission line CPW10b_3 having an input end connected to the terminal end of the transmission line CPW20b_2 of the amplifier block 200b, an output transmission line CPW20b_3 having a terminal end connected to the signal output terminal 2, an input termination resistor Ri3 having a first end connected to the terminal end of the transmission line CPW10b_3 and a second end connected to a bias voltage Vb_3, an output termination resistor Ro3 having a first end connected to the input end of the transmission line CPW20b_3 and a second end connected to the ground, and a plurality of unit cells 3_3 arranged along the transmission lines CPW10b_3 and CPW20b_3, each of the unit cells having an input terminal a3 connected to the transmission line CPW10b_3 and an output terminal b3 connected to the transmission line CPW20b_3. The output termination resistor Ro3 and the input termination resistor Ri3 are 5Ω.

The transmission line CPW10b_3 includes a plurality of transmission lines CPW23, CPW1_3, and CPW10_3 connected in series. The transmission line CPW1_3 between unit cells and the transmission line CPW23 on the input side have different characteristic impedances. The reason is that the transmission line CPW23 needs to absorb the effects of the parasitic capacitance of the amplifier block 200b which is in the previous stage of the transmission line CPW10b_3. Similarly, the transmission lines CPW1_3 and CPW10_3 have different characteristic impedances. The reason is that the transmission line CPW10_3 needs to absorb the effects of the parasitic capacitance of the input termination resistor Ri3.

Note that in the configuration of FIG. 6, the output transmission line CPW20b_2 of the amplifier block 200b and the input transmission line CPW10b_3 of the amplifier block 300b share the transmission line CPW23.

The transmission line CPW20b_3 includes a plurality of transmission lines CPW2_3 and CPW20_3 connected in series. The transmission line CPW2_3 between unit cells and the transmission line CPW20_3 have different characteristic impedances. The reason is that the transmission line CPW20_3 needs to absorb the effects of the parasitic capacitance of the circuit or the like in the subsequent stage of the signal output terminal 2.

Figure 7:
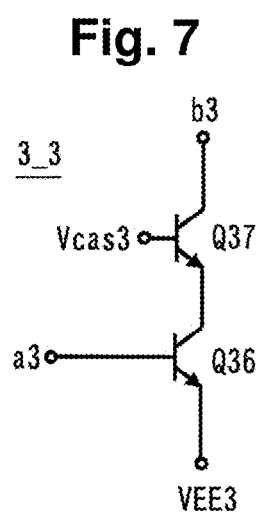

FIG. 7 is a circuit diagram illustrating a configuration of the unit cell 3_3 in the amplifier block 300b. The unit cell 3_3 includes an input transistor Q36 having a base terminal connected to the transmission line CPW10b_3 and an emitter terminal connected to a power supply voltage VEE3, and an output transistor Q37 having a base terminal connected to a bias voltage Vcas3, a collector terminal connected to the transmission line CPW20b_3, and an emitter terminal connected to the collector terminal of the input transistor Q36.

VCC_1, VEE1, Vb_1, Vcas1, VCC_2, VEE2, Vb_2, Vcas2, VEE3, Vb_3, and Vcas3 are negative voltages.

In the configuration of FIG. 6, the value of the power supply voltage VCC_2 is set as shown in the following expression, so that the output common voltage of the amplifier block 200b and the input common voltage of the amplifier block 300b can be set to the same voltage. Hence, it is possible to amplify signals from DC to high frequencies without disordering the operating point of each transistor.

$$VCC\_2=Vb\_3+Iopt \times Nopt \times 50 \tag{3}$$

In the case of four or more amplifier blocks, a configuration the same as or similar to the present embodiment can be applied to it. Specifically, in the case of N amplifier blocks (N is an integer of 2 or more) connected in cascade, the second ends of the input termination resistors Ri1 to RiN are connected to the bias voltages Vb_1 to Vb_N, the second ends of the output termination resistors Ro1 to Ro(N−1) except the one in the last stage are connected to power supply voltages VCC_1 to VCC_(N−1), the second end of the output termination resistor RoN in the last stage is connected to the ground, and the values of the characteristic impedances of all the transmission lines and all the termination resistors are set to 50Ω. In addition, the power supply voltages VCC_n (n is an integer from 1 to N−1) may beset as in the following expression.

$$VCC\_n=Vb\_(n+1)+Iopt \times Nopt \times 50 \tag{4}$$

Third Embodiment

Next, a third embodiment of the present invention will be described. The present embodiment is a specific example of the first embodiment, thus the signs in FIG. 1 are used in the following description. In the second embodiment, the second ends of the output termination resistors of the amplifier blocks except the one in the last stage are connected to the power supply voltages VCC; however, it is desirable for the ease of the current capacity design of wiring and wiring layout, and favorable reflection characteristics that the second ends of the output termination resistors be connected to the ground, as illustrated in the first embodiment.

In the present embodiment, in order that the second ends of the output termination resistors Ro1 and Ro2 of the amplifier blocks 100 and 200 are connected to the ground, and that the output of the amplifier block 100 and the input of the amplifier block 200 are connected at the same DC potential, the characteristic impedance Zo of the output transmission line CPW20_1 of the amplifier block 100, the output termination resistor Ro1, the characteristic impedance Zo of the input transmission line CPW10_2 of the amplifier block 200, and the input termination resistor Ri2 are set as in expression (1).

As an example, in the case in which Vb_2=_3 V, Iopt=5 mA, and Nopt=6, the output termination resistor Ro1 and the input termination resistor Ri2 are 100Ω. Since, with the configuration in the present embodiment, it is possible to set the output impedance of the amplifier block 100 to 50Ω or more, the present embodiment also provides improvement in the gain of the amplifier.

Figure 8:
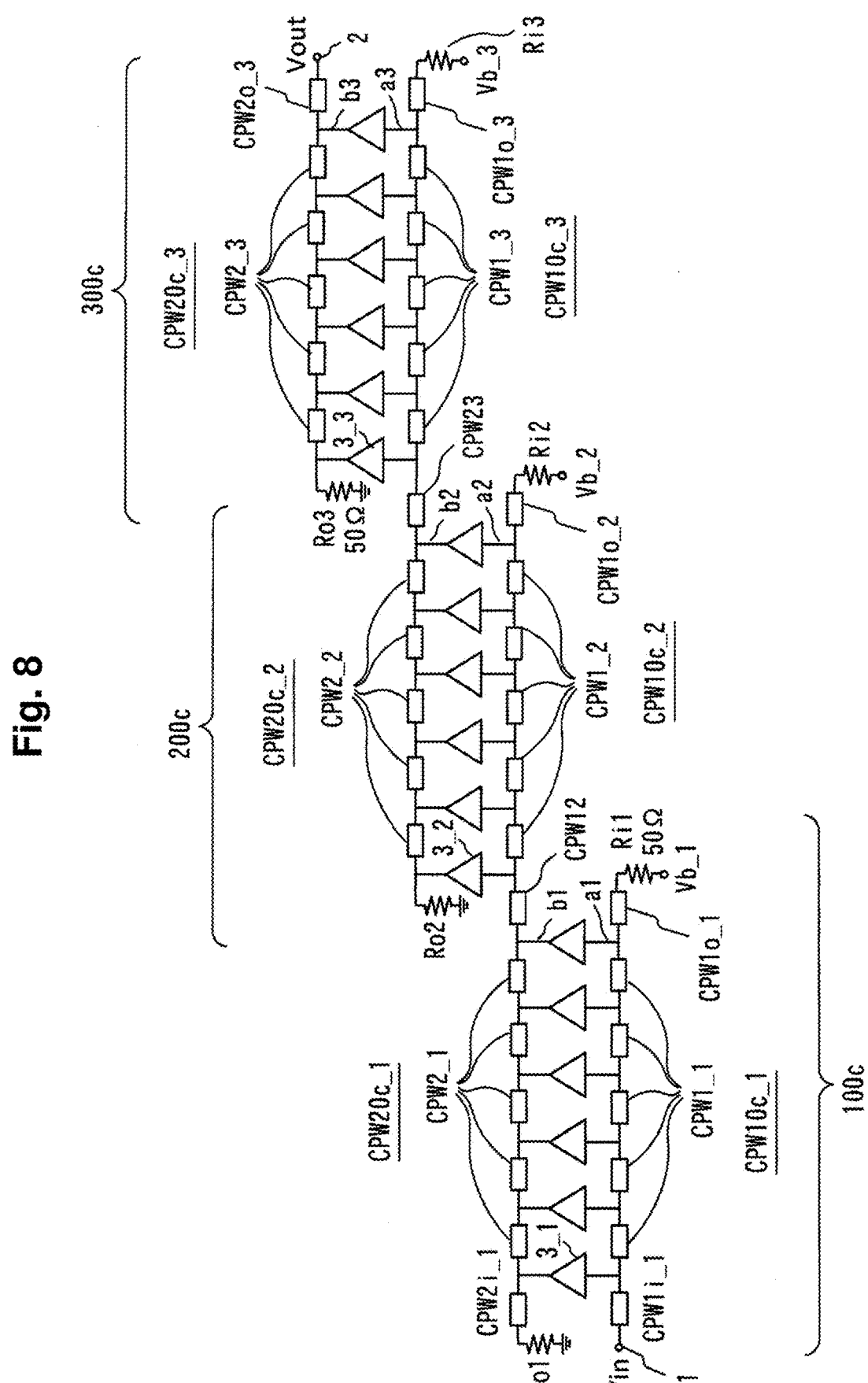
FIG. 8 is a circuit diagram illustrating a configuration of a distributed amplifier according to a third embodiment of the present invention.

Although the first embodiment and the present embodiment have showed cases of two amplifier blocks, the number of amplifier blocks may be three or more. As an example, FIG. 8 illustrates a configuration for a case of three amplifier blocks. The distributed amplifier in FIG. 8 includes an amplifier block 100c, an amplifier block 200c, an amplifier block 300c connected in cascade, the amplifier block 100c having an optimal number (Nopt=6) of stages, the amplifier block 200c having an optimal number (Nopt=6) of stages, the amplifier block 300c having an optimal number (Nopt=6) of stages.

The amplifier block 100c includes an input transmission line CPW10c_1, an output transmission line CPW20c_1, an input termination resistor Ri2, an output termination resistor Ro1, and unit cells 3_1. The amplifier block 100c has the same configuration as the amplifier block 100.

The amplifier block 200c includes an input transmission line CPW10c_2, an output transmission line CPW20c_2, an input termination resistor Ri2, an output termination resistor Ro2, and unit cells 3_2. The amplifier block 200c has a configuration the same as or similar to that of the amplifier block 200 but is different from the first embodiment in that the value of the output termination resistor Ro2 is higher than 50Ω.

The amplifier block 300c includes an input transmission line CPW10c_3, an output transmission line CPW20c_3, an input termination resistor Ri3, an output termination resistor Ro3, and unit cells 3_3. The configuration of the amplifier block 300c is the same as or similar to that of the amplifier block 300b but is different from the second embodiment in that the value of the input termination resistor Ri3 is higher than 50Ω.

In the configuration of FIG. 8, the characteristic impedance Zo of the output transmission line CPW20c_2 of the amplifier block 200c, the output termination resistor Ro2, the characteristic impedance Zo of the input transmission line CPW10c_3 of the amplifier block 300c, and the input termination resistor Ri3 are higher than 50Ω and expressed in the following expression.

$$Zo=Ro2=Ri3=-Vb\_3/(Iopt{\times}Nopt) \qquad (5)$$

In the case of four or more amplifier blocks, a configuration the same as or similar to the present embodiment can be applied to it. Specifically, in the case of N amplifier blocks (N is an integer of 2 or more) connected in cascade, the second ends of the input termination resistors Ri1 to RiN are connected to the bias voltages Vb_1 to Vb_N, the seconds ends of the output termination resistors Ro1 to RoN are connected to the ground, and the input transmission line CPW10c_1 in the first stage, the input termination resistor Ri1, the characteristic impedance of the output transmission line CPW20c_N in the last stage, and the output termination resistor RoN are set to 50Ω.

In addition, the characteristic impedance Zo of the output transmission line of the amplifier block in the n-th stage (n is an integer from 1 to N−1) except the one in the last stage, the output termination resistor Ron, the characteristic impedance Zo of the input transmission line of the amplifier block in the (n+1)-th stage, and the input termination resistor Ri(n+1) may be set as in the following expression.

$$Zo=Ron=Ri(n+1)=-Vb\_(n+1)/(Iopt{\times}Nopt) \qquad (6)$$

Fourth Embodiment

Figure 9:
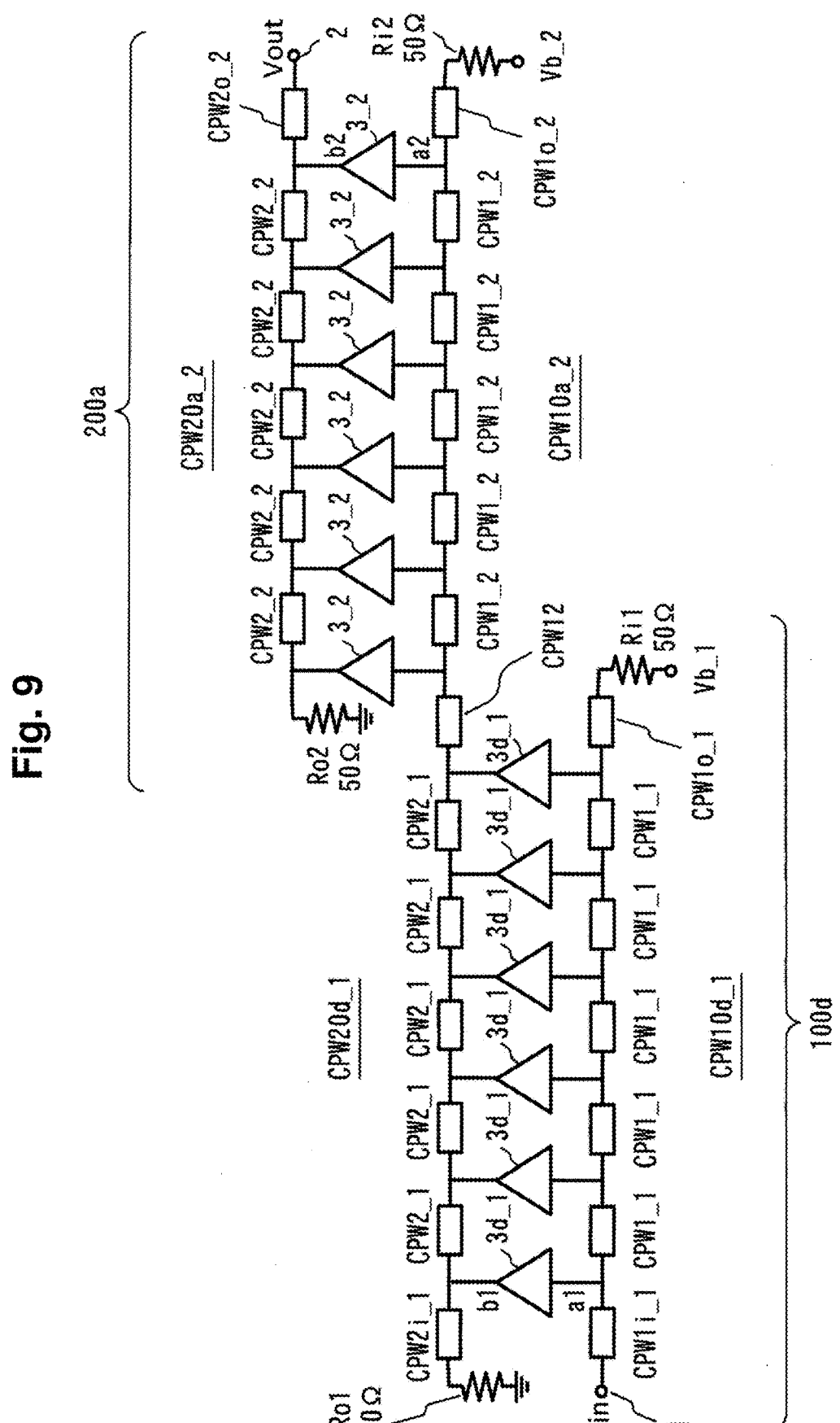
FIG. 9 is a circuit diagram illustrating a configuration of a distributed amplifier according to a fourth embodiment of the present invention.

Next, a fourth embodiment of the present invention will be described. FIG. 9 is a circuit diagram illustrating a configuration of a distributed amplifier according to the fourth embodiment of the present invention. The distributed amplifier of the present embodiment includes an amplifier block mod and an amplifier block 200d connected in cascade, the amplifier block mod having an optimal number (Nopt_1=6) of stages, the amplifier block 200d having an optimal number (Nopt_2=6) of stages.

The amplifier block mod includes an input transmission line CPW10d_1, an output transmission line CPW20d_1, an input termination resistor Ri1, an output termination resistor Ro1, and a plurality of unit cells 3d_1 arranged along the transmission lines CPW10d_1 and CPW20d_1, each of the unit cells having an input terminal a1 connected to the transmission line CPW10d_1 and an output terminal b1 connected to the transmission line CPW20d_1.

The amplifier block mod has a configuration the same as or similar to that of the amplifier block 100a but is different in that the second end of the output termination resistor Ro1 is connected to the ground, not to the power supply voltage VCC_1 and that the unit cell 3d_1 is different from the one in the amplifier block 100a.

The configuration of the amplifier block 200a is as described in the second embodiment.

Figure 10:
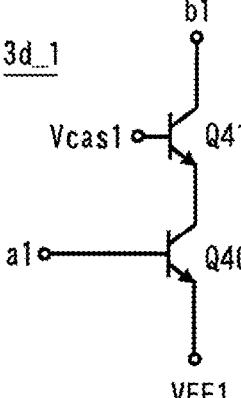
FIG. 10 is a circuit diagram illustrating a configuration of a unit cell of the distributed amplifier according to the fourth embodiment of the present invention.

FIG. 10 is a circuit diagram illustrating a configuration of the unit cell 3d_1 of the amplifier block mod. As illustrated in FIG. 10, the unit cell 3d_1 includes an input transistor Q40 having a base terminal connected to the transmission line CPW10d_1 and an emitter terminal connected to the power supply voltage VEE1, and an output transistor Q41 having a base terminal connected to the bias voltage Vcas1, a collector terminal connected to the transmission line CPW20d_1, and an emitter terminal connected to the collector terminal of the input transistor Q40.

In the third embodiment, there are cases in which it is difficult to design such that the characteristic impedances of the transmission lines are higher than 50Ω (for example, high at 100Ω or so). In such cases, it is possible to connect the output of the amplifier block 100d and the input of the amplifier block 200d at the same DC potential, by setting the values of the characteristic impedances of all the transmission lines and all the termination resistors to 50Ω as in the second embodiment and by using transistors Q40 and Q41 whose optimal currents Iopt_1 are as in the following expression, in the unit cells 3d_1 of the amplifier block mod.

$$Iopt\_1=-Vb\_2/(Nopt\_1{\times}50) \qquad (7)$$

In the first to third embodiments, the amplifier blocks having the same number of stages (the same number of unit cells arranged in parallel) are used. However, in the present embodiment, the number of stages Nopt_1 in the amplifier block mod is the optimal number of stages for the case in which the unit cell 3d_1 is composed of transistors whose optimal currents are Ipot1, and can be different from the number of stages Nopt_2 in the amplifier block 200a.

In general, a bipolar transistor has an optimal collector current density in which the current-gain cutoff frequency fT or the maximum oscillation frequency fmax is highest (in other words, in which the transistor operates at the highest speed). The optimal current of a bipolar transistor having a certain emitter area (the emitter length×the emitter width) is defined by the optimal collector current density×the emitter area. Hence, the longer the emitter length is, or the larger the number of fingers is, the larger the optimal current is. By operating a bipolar transistor used in a circuit at its optimal current, it is possible to make the bandwidth largest. In the case of using bipolar transistors as described above, the optimal current can be adjusted by adjusting the emitter length or the number of fingers.

In general, the optimal current Iopt_1 of each transistor of the unit cell 3d_1 in the amplifier block mod has a larger value than the optimal current Iopt_2 of each transistor of the unit cell 3_2 in the amplifier block 200a.

Thus, the emitter length of each transistor used in the amplifier block mod is larger than the emitter length of each transistor used in the amplifier block 200a, or the number of fingers of each transistor used in the amplifier block 100d is larger than the number of fingers of each transistor used in the amplifier block 200.

Figure 11:
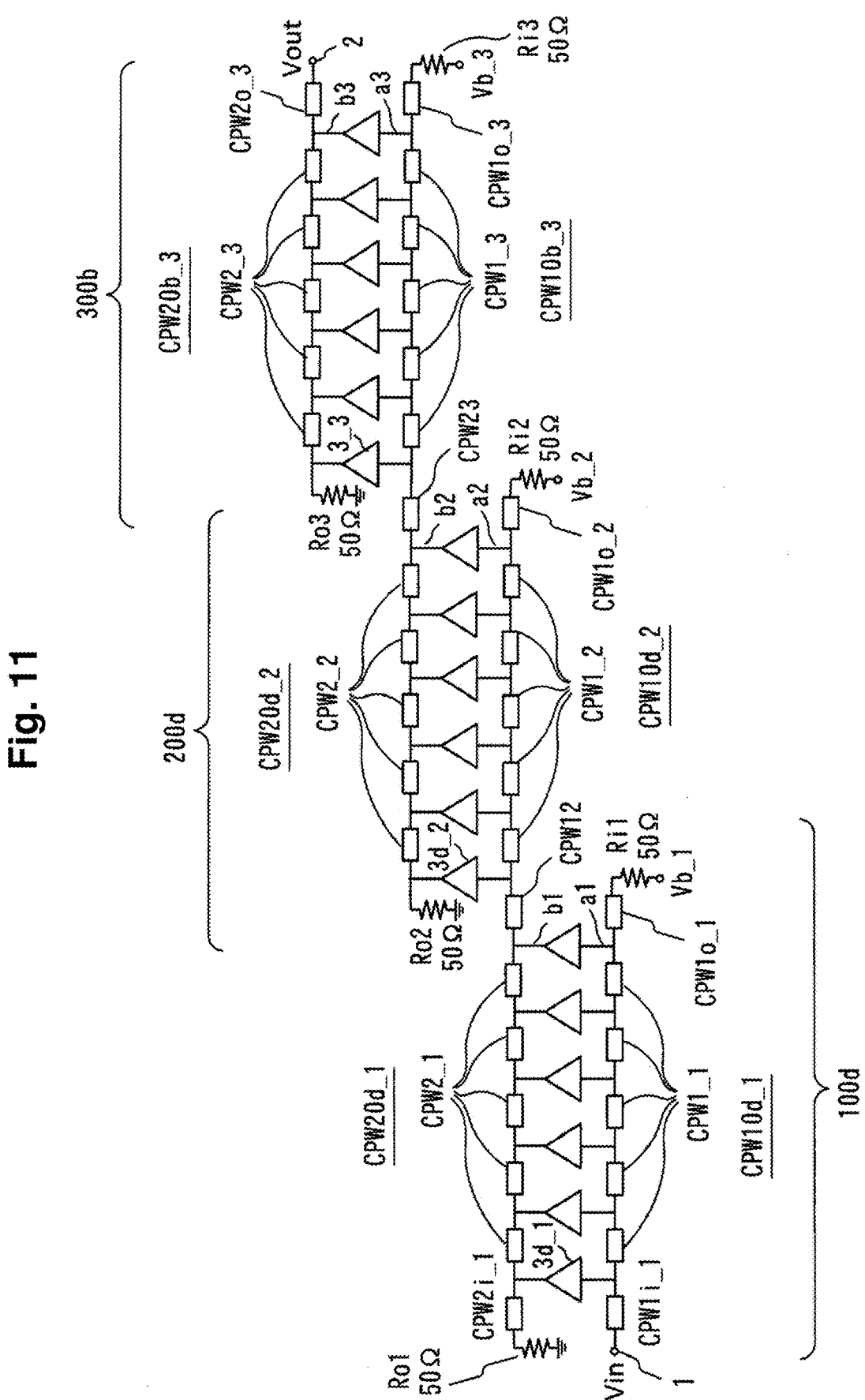
FIG. 11 is a circuit diagram illustrating another configuration of a distributed amplifier according to the fourth embodiment of the present invention.

Although the present embodiment has showed a case of two amplifier blocks, the number of amplifier blocks may be three or more. As an example, FIG. 11 illustrates a configuration for a case of three amplifier blocks. The distributed amplifier in FIG. 11 includes an amplifier block mod, an amplifier block 200d, and an amplifier block 300b connected in cascade, the amplifier block 100d having an optimal number (Nopt_1=6) of stages, the amplifier block 200d having an optimal number (Nopt_2=6) of stages, the amplifier block 300b having an optimal number (Nopt_3=6) of stages.

The amplifier block 200d includes an input transmission line CPW10d_2, an output transmission line CPW20d_2, an input termination resistor Ri2, an output termination resistor Ro2, and a plurality of unit cells 3d_2 arranged along the transmission lines CPW10d_2 and CPW20d_2, each of the unit cells having an input terminal a2 connected to the transmission line CPW10d_2 and an output terminal b2 connected to the transmission line CPW20d_2.

The amplifier block 200d has a configuration the same as or similar to that of the amplifier block 200b, but is different in that the second end of the output termination resistor Ro2 is connected to the ground, not to the power supply voltage VCC_2 and that the unit cell 3d_2 is different from the one in the amplifier block 200b.

The configuration of the amplifier block 300b is as described in the second embodiment.

Figure 12:
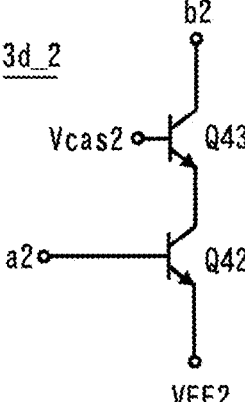
FIG. 12 is a circuit diagram illustrating a configuration of a unit cell of the distributed amplifier according to the fourth embodiment of the present invention.
Figure 13:
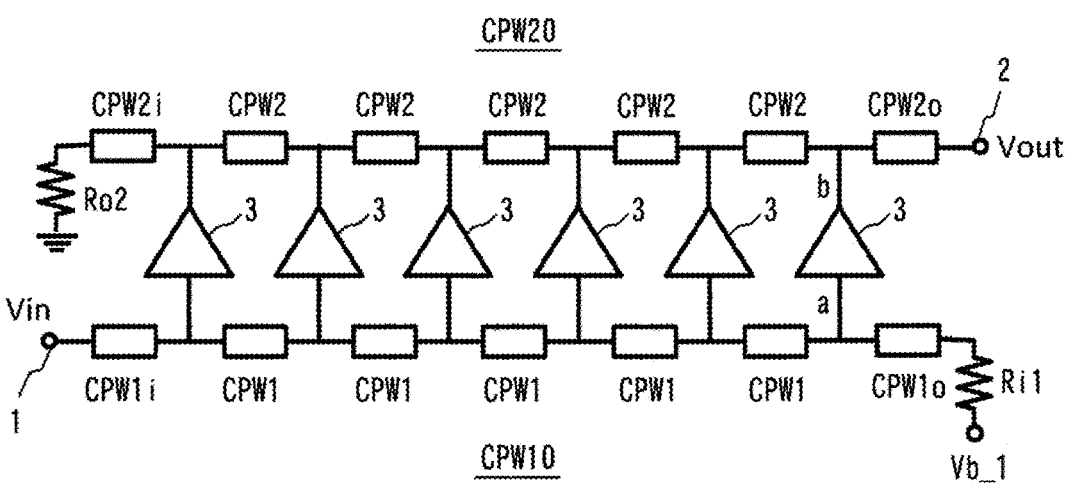
FIG. 13 is a circuit diagram illustrating a configuration of a conventional distributed amplifier.
Figure 16:
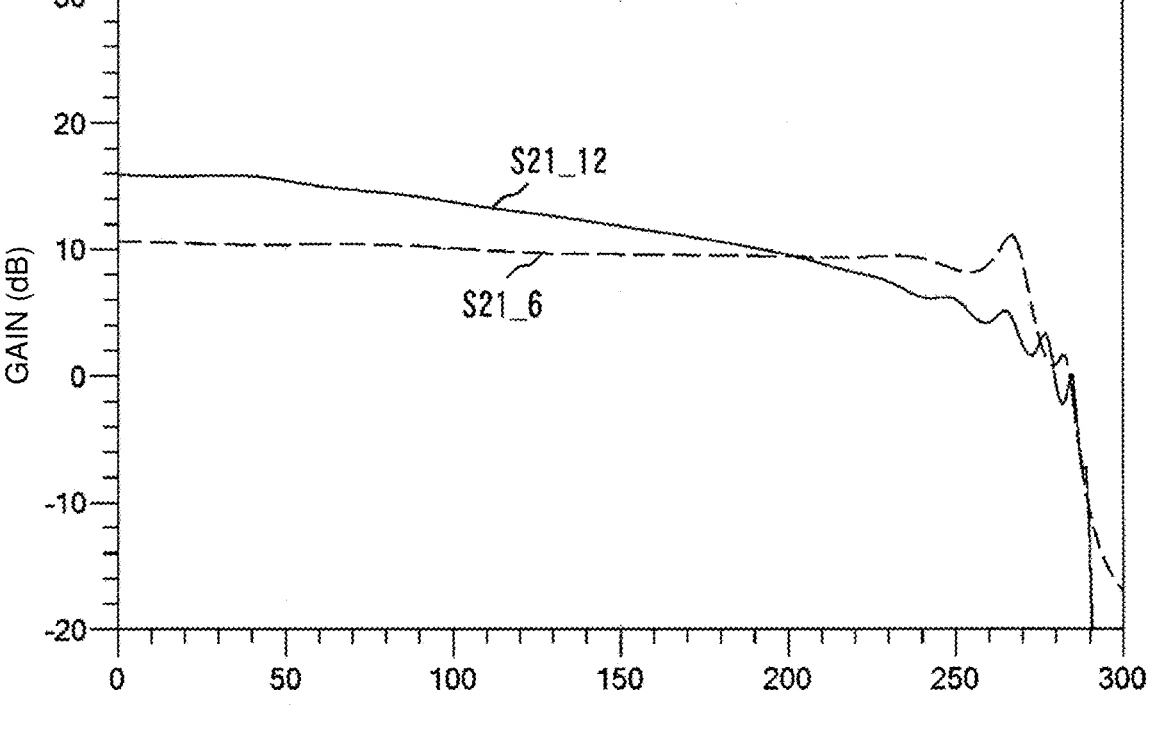
FIG. 16 is a graph illustrating simulation results of the S parameters of conventional distributed amplifiers.

FIG. 12 is a circuit diagram illustrating a configuration of the unit cell 3d_2 in the amplifier block 200d. The unit cell 3d_2 includes an input transistor Q42 having a base terminal connected to the transmission line CPW10d_2 and an emitter terminal connected to the power supply voltage VEE2, and an output transistor Q43 having a base terminal connected to the bias voltage Vcas2, a collector terminal connected to the transmission line CPW20d_2, and an emitter terminal connected to the collector terminal of the input transistor Q42.

By using the transistors Q42 and Q43 whose optimal currents Iopt_2 are as in the following expression, in the unit cells 3d_2 of the amplifier block 200d, it is possible to connect the output of the amplifier block 200d and the input of the amplifier block 300b at the same DC potential.

$$Iopt\_2 = -Vb\_3/(Nopt\_2 \times 50) \qquad (8)$$

The first to third embodiments use the amplifier blocks having the same number of stages (the same number of unit cells arranged in parallel). However, in the present embodiment, the number of stages Nopt_2 in the amplifier block 200d is an optimal number for the case in which the unit cell 3d_2 is composed of transistors whose optimal currents are Ipot2, and can be different from the numbers of stages Nopt_1 and Nopt_3 in the amplifier blocks mod and 300b.

In the case of four or more amplifier blocks, a configuration the same as or similar to the present embodiment can be applied to it. Specifically, in the case of N amplifier blocks (N is an integer of 2 or more) connected in cascade, the second ends of the input termination resistors Ri1 to RiN are connected to the bias voltages Vb_1 to Vb_N, the second ends of the output termination resistors Ro1 to RoN are connected to the ground, and the values of the characteristic impedances of all the transmission lines and all the termination resistors are set to 50Ω

Further, for the transistors used in each of the unit cells 3d_n in the amplifier block in the n-th (n is an integer from 1 to N−1) stage except the last stage, transistors whose optimal currents Iopt_n are expressed by the following expression may be used.

$$Iopt\_n = -Vb\_(n+1)/(Nopt\_n \times 50) \qquad (9)$$

Although the first to fourth embodiments show examples of using bipolar transistors in the unit cells, MOS transistors can also be used. When MOS transistors are used, base terminals are replaced with gate terminals in the above description, collector terminals with drain terminals, and emitter terminals with source terminals.

Although the first to fourth embodiments show cases of using coplanar waveguides (CPWs) for the transmission lines, the transmission lines are not limited to CPWs, but they can be any transmission lines such as microstoplines.

INDUSTRIAL APPLICABILITY

The embodiments of the present invention are applicable to distributed amplifiers that need to amplify signals from DC to high frequencies.

REFERENCE SIGNS LIST

1 Signal input terminal
2 Signal output terminal
3, 3d Unit cell
100, 100a to 100d, 200, 200a to 200d, 300b, 300c Amplifier block
CPW1, CPW1i, CPW10, CPW2, CPW2i, CPW20, CPW10, CPW10a to CPW10d,
CPW20, CPW20a to CPW20d Transmission line
Q40 to Q43 Transistor
Ri1 to Ri3, Ro1 to Ro3 Resistor

The invention claimed is:

1. A distributed amplifier comprising:
N amplifier blocks, where N is an integer of 2 or more, each of the amplifier blocks including:
  a first transmission line having an input end that receives input of a signal,
  a second transmission line having an output end that outputs a signal,
  a first termination resistor having a first end connected to a terminal end of the first transmission line,
  a second termination resistor having a first end connected to an input end of the second transmission line, and
  a plurality of unit cells arranged along the first and second transmission lines, each of the unit cells having an input terminal connected to the first transmission line and an output terminal connected to the second transmission line, wherein:
the amplifier blocks are connected in cascade such that a terminal end of the second transmission line of one of the amplifier blocks is connected to the input end of the first transmission line of a subsequent amplifier block,
a second end of the first termination resistor of each of the amplifier blocks is connected to a first bias voltage, a second end of the second termination resistor of each of the amplifier blocks except the amplifier block in a last stage is connected to a first power supply voltage, and a second end of the second termination resistor of the amplifier block in the last stage is connected to a ground, values of the characteristic impedances of all the transmission lines and all the first and second termination resistors are $50\Omega$, and the first power supply voltage of the amplifier block in an n-th stage is set to $Vb\_(n+1)+Iopt\times Nopt\times 50$, where n is an integer from 1 to N−1, $Vb\_(n+1)$ is the first bias voltage of the amplifier block in an (n+1)-th stage, Nopt is the number of the unit cells in each of the amplifier blocks, and Iopt is the current that flows between the input terminal and the output terminal in each of the unit cells.

2. The distributed amplifier according to claim 1, wherein each of the unit cells includes:

a first transistor having a base terminal connected to the first transmission line and an emitter terminal connected to a second power supply voltage, and a second transistor having a base terminal connected to a second bias voltage, a collector terminal connected to the second transmission line, and an emitter terminal connected to the collector terminal of the first transistor.

3. A distributed amplifier comprising:

N amplifier blocks, where N is an integer of 2 or more, each of the amplifier blocks including:

a first transmission line having an input end that receives input of a signal, a second transmission line having an output end that outputs a signal, a first termination resistor having a first end connected to a terminal end of the first transmission line, a second termination resistor having a first end connected to an input end of the second transmission line, and a plurality of unit cells arranged along the first and second transmission lines, each of the unit cells having an input terminal connected to the first transmission line and an output terminal connected to the second transmission line, wherein:

the amplifier blocks are connected in cascade such that a terminal end of the second transmission line of one of the amplifier blocks is connected to the input end of the first transmission line of a subsequent amplifier block, a second end of the first termination resistor of each of the amplifier blocks is connected to a first bias voltage, and a second end of the second termination resistor of each of the amplifier blocks is connected to a ground, values of the first transmission line of the amplifier block in a first stage, the first termination resistor of the amplifier block in the first stage, the characteristic impedance of the second transmission line of the amplifier block in a last stage, and the second termination resistor of the amplifier block in the last stage are $50\Omega$, and the characteristic impedance of the second transmission line of the amplifier block in an n-th stage, the second termination resistor of the amplifier block in the n-th stage, the characteristic impedance of the first transmission line of the amplifier block in an (n+1)-th stage, and the first termination resistor of the amplifier block in the (n+1)-th stage are set to $-Vb\_(n+1)/(Iopt\times Nopt)$, where n is an integer from 1 to N−1, $Vb\_(n+1)$ is the first bias voltage of the amplifier block in the (n+1)-th stage, Nopt is the number of the unit cells in each of the amplifier blocks, and Iopt is the current that flows between the input terminal and the output terminal in each of the unit cells.

4. The distributed amplifier according to claim 3, wherein each of the unit cells includes:

a first transistor having a base terminal connected to the first transmission line and an emitter terminal connected to a second power supply voltage, and a second transistor having a base terminal connected to a second bias voltage, a collector terminal connected to the second transmission line, and an emitter terminal connected to the collector terminal of the first transistor.

5. A distributed amplifier comprising:

N amplifier blocks, where N is an integer of 2 or more, each of the amplifier blocks including:

a first transmission line having an input end that receives input of a signal, a second transmission line having an output end that outputs a signal, a first termination resistor having a first end connected to a terminal end of the first transmission line, a second termination resistor having a first end connected to an input end of the second transmission line, and a plurality of unit cells arranged along the first and second transmission lines, each of the unit cells having an input terminal connected to the first transmission line and an output terminal connected to the second transmission line, wherein:

the amplifier blocks are connected in cascade such that a terminal end of the second transmission line of one of the amplifier blocks is connected to the input end of the first transmission line of a subsequent amplifier block, a second end of the first termination resistor of each of the amplifier blocks is connected to a first bias voltage, and a second end of the second termination resistor of each of the amplifier blocks is connected to a ground, the values of the characteristic impedances of all the transmission lines and all the first and second termination resistors are $50\Omega$, and a transistor whose optimal current is $-Vb\_(n+1)/(Nopt\_n\times 50)$ is used in each of the unit cells of the amplifier block in the n-th stage, where n is an integer from 1 to N−1, $Vb\_(n+1)$ is the first bias voltage of the amplifier block in the (n+1)-th stage, and $Nopt\_n$ is the number of the unit cells of the amplifier block in the n-th stage.

6. The distributed amplifier according to claim 5, wherein each of the unit cells includes:

a first transistor having a base terminal connected to the first transmission line and an emitter terminal connected to a second power supply voltage, and a second transistor having a base terminal connected to a second bias voltage, a collector terminal connected to the second transmission line, and an emitter terminal connected to the collector terminal of the first transistor.

* * * * *